United States Patent
Gamalski et al.

(10) Patent No.: US 11,424,551 B2
(45) Date of Patent: Aug. 23, 2022

(54) MODULAR ELECTRONICALLY SCANNED ARRAY (ESA)

(71) Applicant: RAYTHEON COMPANY, Waltham, MA (US)

(72) Inventors: Andrew Gamalski, Tucson, AZ (US); Andrew K. Brown, Tucson, AZ (US); Darren Himbaza, Tucson, AZ (US); Kenneth W. Brown, Yucaipa, CA (US)

(73) Assignee: Raytheon Company, Waltham, MA (US)

( * ) Notice: Subject to any disclaimer, the term of this patent is extended or adjusted under 35 U.S.C. 154(b) by 669 days.

(21) Appl. No.: 16/446,339

(22) Filed: Jun. 19, 2019

(65) Prior Publication Data

US 2020/0403320 A1    Dec. 24, 2020

(51) Int. Cl.
*H01Q 21/00* (2006.01)
*H01Q 1/02* (2006.01)
*H01Q 1/22* (2006.01)
*H04B 1/04* (2006.01)
*H05K 7/20* (2006.01)

(52) U.S. Cl.
CPC ........... *H01Q 21/0093* (2013.01); *H01Q 1/02* (2013.01); *H01Q 1/2283* (2013.01); *H04B 2001/0408* (2013.01); *H05K 7/205* (2013.01)

(58) Field of Classification Search
CPC ........... H01Q 21/0093; H01Q 21/0025; H01Q 21/065; H01Q 1/02; H01Q 1/2283
See application file for complete search history.

(56) References Cited

U.S. PATENT DOCUMENTS 6,184,832 B1 * 2/2001 Geyh .................... H01Q 21/065 343/700 MS
7,348,932 B1 * 3/2008 Puzella .............. H01Q 21/0025 342/373

(Continued)

FOREIGN PATENT DOCUMENTS

CN        103457015 B    4/2015

OTHER PUBLICATIONS

International Search Report for corresponding International Application No. PCT/US2020/025348, filed Mar. 27, 2020, International Search Report dated Jun. 30, 2020 and dated Jul. 15, 2020 (4 pgs.).

(Continued)

*Primary Examiner* — Hoang V Nguyen
(74) *Attorney, Agent, or Firm* — Lewis Roca Rothgerber Christie LLP (57) ABSTRACT

A modular communications array includes: an antenna card including a patch antenna array for communicating RF signals; a chip carrier card including a plurality of monolithic microwave integrated circuits (MMICs), each with a power amplifier (PA) and positioned on a respective metal post of a plurality of metal posts, wherein; a phase shifter card including a plurality of phase shifter circuits for beam steering and gain control and a plurality of cavities. Each of the cavities corresponds to a location for the respective metal post on the chip carrier card; and a cooling block coupled to the chip carrier card by a thermally conductive epoxy for cooling, where the phase shifter card is replaceable without affecting the components of the antenna card and the chip carrier card.

9 Claims, 8 Drawing Sheets

(56) References Cited

U.S. PATENT DOCUMENTS

2017/0099726 A1 4/2017 Elliott et al.
2018/0316096 A1 11/2018 Harauchi

OTHER PUBLICATIONS

Written Opinion of the International Searching Authority for corresponding International Application No. PCT/US2020/025348, filed Mar. 27, 2020, Written Opinion of the International Searching Authority dated Jul. 15, 2020 (6 pgs.).

* cited by examiner

MODULAR ELECTRONICALLY SCANNED ARRAY (ESA)

FIELD OF THE INVENTION

The present invention relates generally to antenna arrays and more specifically to modular electronically scanned arrays.

BACKGROUND

An antenna array is a group of multiple active antennas coupled to a common source or load to produce a directive radiation pattern. Usually, the spatial relationship of the individual antennas also contributes to the directivity of the antenna array. A phased array antenna is an array of antennas in which the relative phases of the signals feeding the antennas are varied in a manner that the effective radiation pattern of the entire array is reinforced in a desired direction and suppressed in undesired directions.

Figure 1:
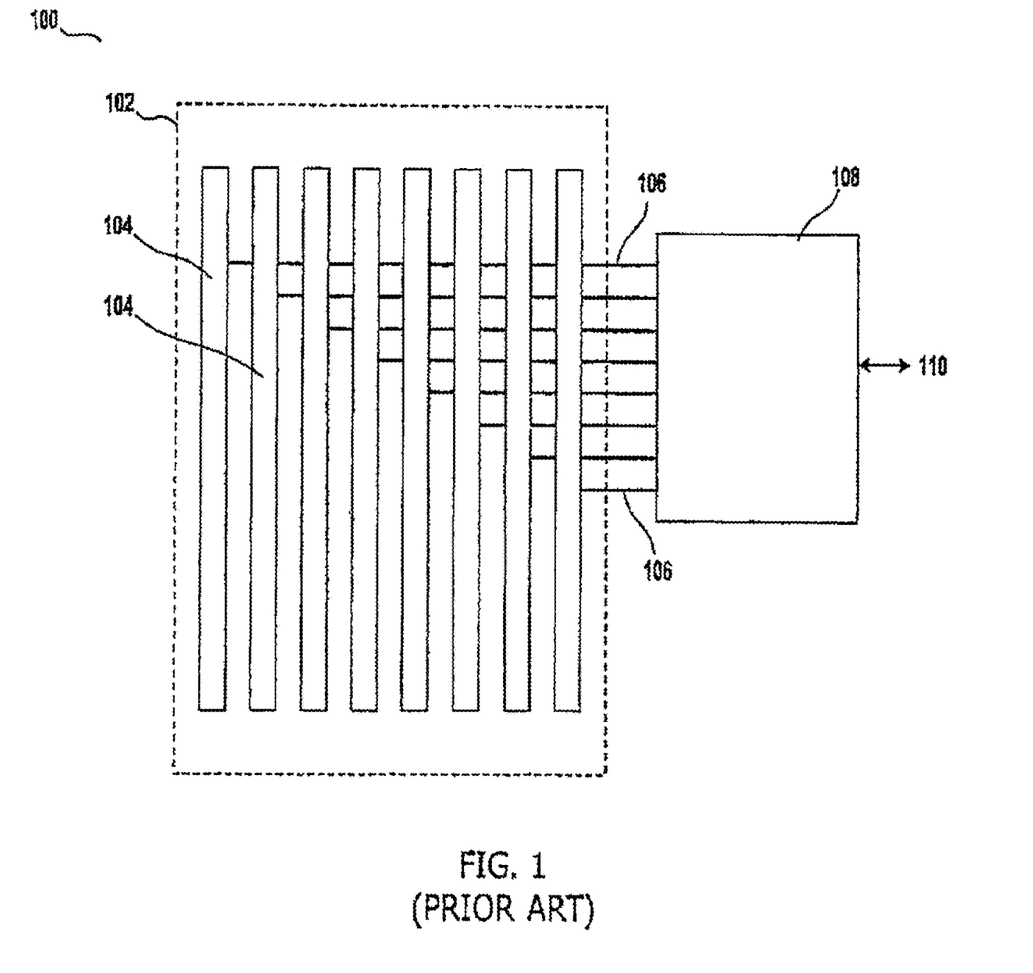
FIG. 1 shows a diagram of a conventional antenna array.

FIG. 1 shows a diagram of a conventional antenna array 100. The antenna array 100 includes several linear arrays 104 housed in a (non-metallic) radome 102. Here, each linear array 104 is arranged vertically with spacing between each other, which is determined by the desired resonant frequency of the antenna array 100. Each linear array 102 is connected to its associated radio frequency (RF) electronics circuitry contained in an external RF electronics module 108, via an antenna feed 106. The RF electronics module 108 is connected to external systems via a connection 110 for power, control, and communications connections; and may be physically mounted on the radome 102, or may be located remotely or outside of the antenna array 100.

An Electronically Scanned Array (ESA) is a type of phased array antenna, in which transceivers include a large number of solid-state transmit/receive modules. In ESAs, an electromagnetic beam is emitted by broadcasting radio frequency energy that interferes constructively at certain angles in front of the antenna. An active electronically scanned array (AESA) is a type of phased array radar whose transmitter and receiver (transceiver) functions are composed of numerous small solid-state transmit/receive modules (TRMs). AESA radars aim their beam by emitting separate radio waves from each module that interfere constructively at certain angles in front of the antenna. ESA antenna AESA antenna designs provide dense-packed, high-reliability electronics.

A phased array antenna may include a plurality of transmit/receive integrated microwave module (TRIMM) assemblies that are arranged adjacent to one another in an array assembly, and a plurality of radiating elements extending from each of the TRIMM assemblies. The TRIMM assemblies each include a column or plate portion to which other components are attached. Electrical performance of a phased array antenna depends on various factors, for example, the orientation of the various features in the antenna as well as the arrangement and intercommunication between these various features. The phased array antenna may also include one or more air-cooled or water cooled multi-beam transmit and receive ($T_x/R_x$) monolithic microwave integrated circuits (MMICs), and patch antenna elements.

Modern AESAs are highly integrated RF systems that are expensive to design and develop, have long development times, and are burdened with complex obsolescence management. In modern AESA systems the amplification, phase shifting, and other RF electronics cannot be easily decoupled from each other. Therefore, improvement in one electrical subsystem may necessitate a complete system redesign. In contrast, the modular AESA design topology proposed in this patent would reduce the cost and complexity of incorporating new RF electronic hardware into the AESA stack.

It is worth emphasizing that commercial scanning array technology provides only short range capability since a discrete power amplifier is not commonly used. To realize long range performance, it is necessary to use a high power gallium nitride (GaN) MMIC. The incorporation of the GaN MMIC, which typically have longer product life cycles compared to the commercial phase shifter part, creates a need for a modular architecture that easily decouples the power amplifiers from the phase shifters for streamlined obsolescence management. With a conventional AESA system, changing either the phase shifting or the amplification layer would necessitate re-engineering entire scanning array electronics system. Consequently, the high cost of system redesign limits technological improvement to the system's components.

Therefore, there is a need for a modular, low cost, low development-time antenna array that can be easily integrated to provide a larger and thus more capable antenna array.

SUMMARY

In some embodiments, the disclosed invention is a low cost modular scanning array communication system enabling rapid system upgrades and new product rollouts and long range communications capability.

In some embodiments, the disclosed invention is modular communications array that includes: an antenna card including a patch antenna array for communicating RF signals; a chip carrier card including a plurality of monolithic microwave integrated circuits (MMICs), each with a power amplifier (PA) and positioned on a respective metal post of a plurality of metal posts, wherein; a phase shifter card including a plurality of phase shifter circuits for beam steering and gain control and a plurality of cavities, wherein each of the cavities corresponds to a location for the respective metal post on the chip carrier card; and a cooling block coupled to the chip carrier card by a thermally conductive epoxy for cooling, wherein the phase shifter card is replaceable without affecting the components of the antenna card and the chip carrier card.

In some embodiments, the modular communications array may further include coaxial cable routing for routing the RFs signal from the phase shifter card to the antenna card through the cooling block. The cross-sectional area of the cavities may be larger than a size of the top view footprint of the posts to allow the posts to slide into the cavities. The plurality of metal posts are made of copper.

In some embodiments, the metal posts are attached to the chip carrier card by a subtractive process or by a brazing compound and each of the cavities may include conductive pads for wire bonds to connect the MMICs to the phase shifter card.

BRIEF DESCRIPTION OF THE DRAWINGS

These and other features, aspects, and advantages of the present invention will become better understood with regard to the following description, appended claims, and accompanying drawings.

DETAILED DESCRIPTION

In some embodiments, the disclosed invention is a modular communication system, where the phase shifter layer (card), amplification layer (chip carrier), cooling block (water block), and antenna layer (card) are all decoupled from each other in a vertical (Z) direction and therefore detachable.

Figure 2A:
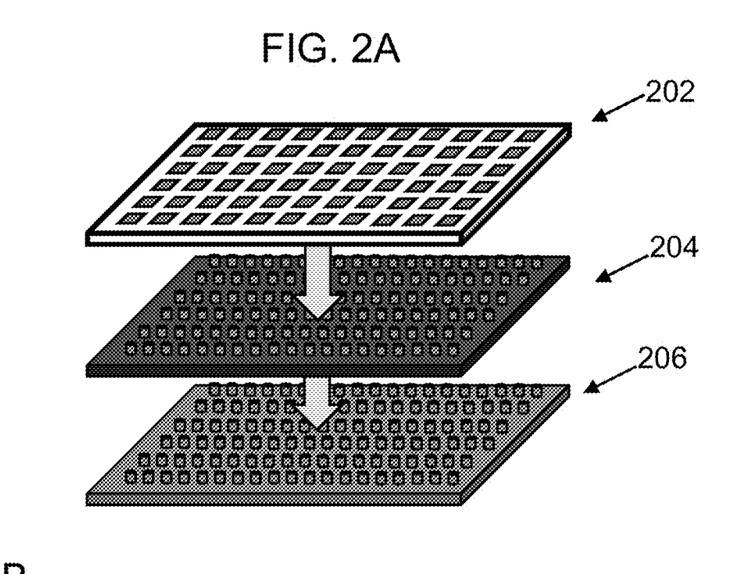
FIGS. 2A and 2B are simplified diagrams of relevant layers of a modular communication system, according to some embodiments of the disclosed invention.
Figure 2B:
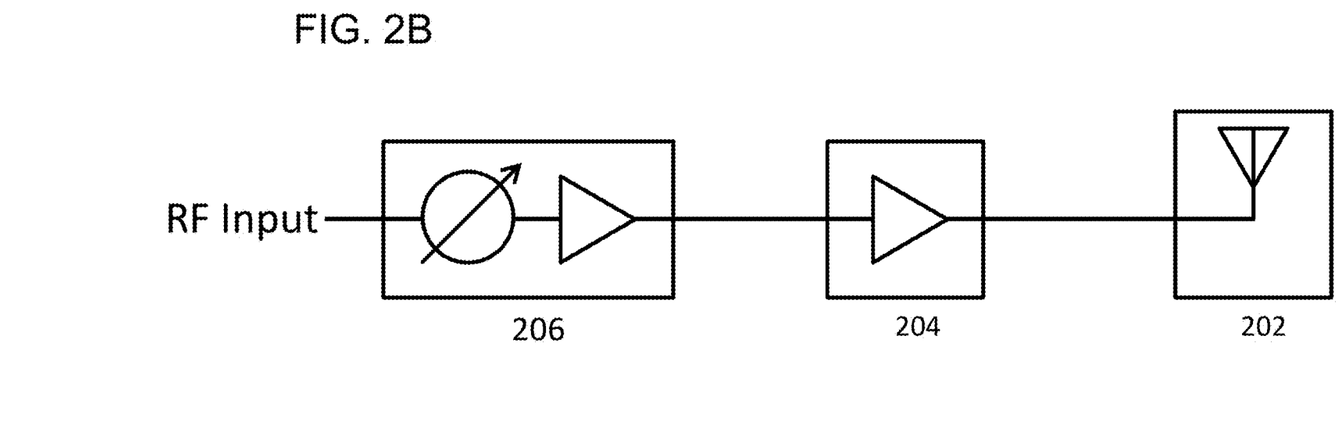

FIGS. 2A and 2B are simplified diagram of relevant layers or cards of a modular communication system, according to some embodiments of the disclosed invention. As shown, an antenna card 202, power amplifier (PA) layer (chip carrier) 204 for placement of PAs, for example, gallium nitride (GaN) MMIC PAs, and phase shifter card 206 are configured separately and assembled together in a modular way. This ensures that each layer (card or chip carrier) can be easily decoupled and replaced by a similar layer. The antenna card 202 includes a patch antenna array enabling $T_x/R_x$ communication. In some embodiments, the PA layer 204 includes a set of GaN MMIC PAs on a metal chip carrier that increase the output power of the mm-wave signal enabling long range communication capability. The phase shifter card 206 enables beam steering and gain control and may include commercial parts with short use windows (before newer components become available). Consequently, obsolescence management of card 206 is desirable. This involves swapping the phase shifter card as new phase shifters become commercially available without reengineering the antenna card (202) and power amplifier layer (204). As depicted in FIG. 2B, there is a single phase shifter card 206 to the antenna pathway.

Figure 2C:
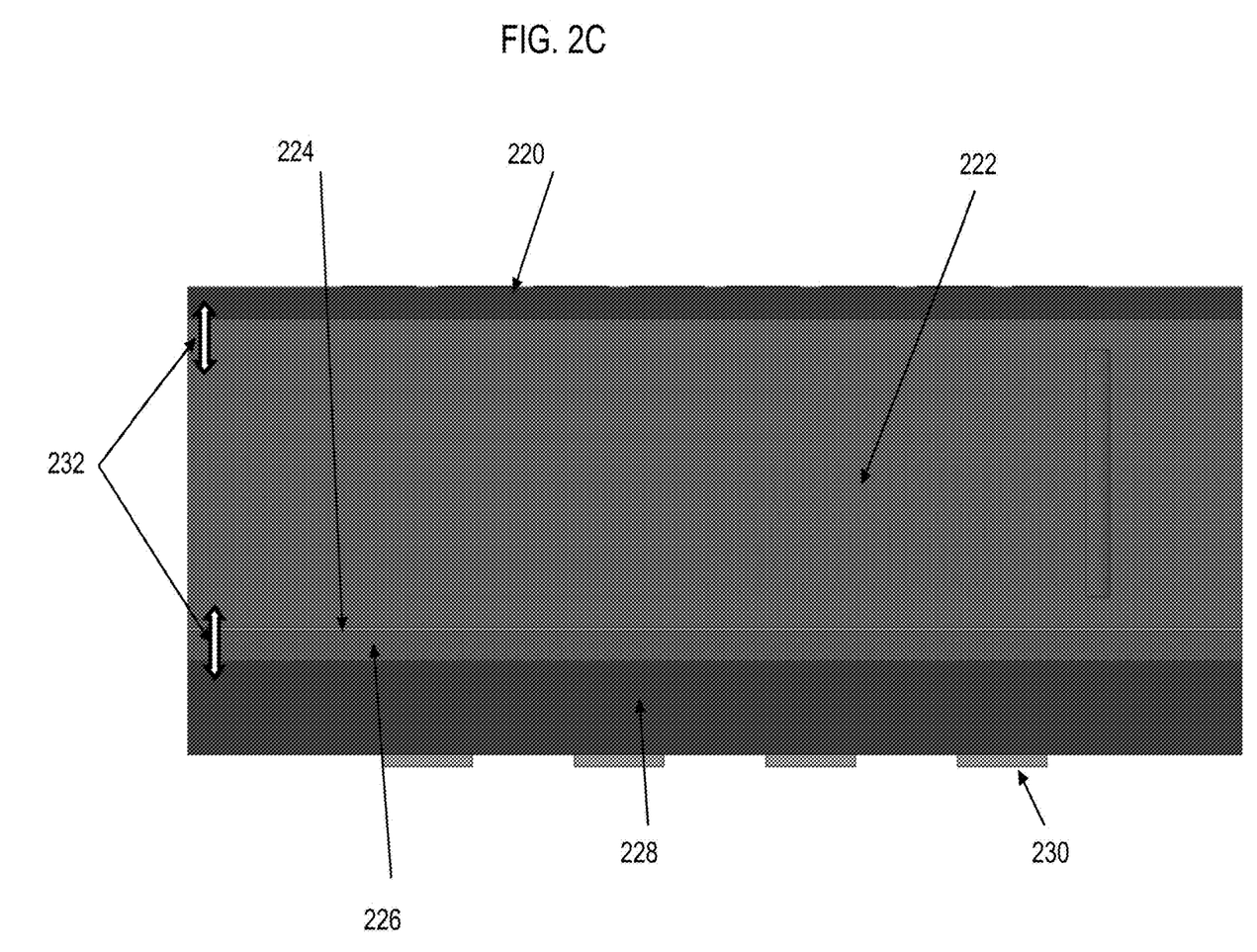
FIG. 2C is an exemplary simplified diagram of a side view of relevant layers of a modular communication system, according to some embodiments of the disclosed invention.

FIG. 2C is an exemplary simplified diagram of a side view of relevant layers or cards for a modular communication system, according to some embodiments of the disclosed invention. As depicted, an antenna card 220, a cooling block 222 for cooling, a thermal interface compound 224, a chip carrier card 226 including monolithic microwave integrated circuits (MMICs) (e.g., GaN MMICs) and a phase shifter card 228 are assembled together to form a modular communication system. The antenna card 220 generates the beam pattern associated with the RF signal. The cooling block 222 provides cooling for both the MMICs (on card 226) and the phase shifter integrated circuit (on card 228). Thermal interface compounds 224 ensures there is a low thermal conductivity joint between the chip carrier card 226 and the cooling block 222. The thermal interface compound 224 provides the cooling efficiency of the cooling block. In some embodiments, in addition to the PAs, the MMICs include low noise amplifiers, a switch, and related components.

In some embodiments, the power amplifier MMCs are mounted on top of (copper) posts which are attached to a metal chip carrier. In some embodiments, the metal chip carrier also acts as a heat sink providing thermal conduction pathway to the cooling block to enable thermal management. The phase shifter card 228 houses the phase shifter integrated circuits 230 and provides signal routing including RF signal routing, enables gain control, and provides beam steering for the modular communications system. In some embodiments, this card has cavities (e.g., holes) in places at key locations where the MMIC power amplifiers atop posts on the chip carrier are positioned. The cavities in this card correspond to the post locations on the chip carrier 226 which the MMICs are mounted on top of. These MMICs are placed on posts and located to the top of chip carrier 226 to allow for wire bonding between the GaN MMIC and the phase shifter card.

Since the MMICs are housed on a chip carrier 228 (see FIG. 6A for an isometric view of the chip carrier) which is separate from the phase shifter card 228, it is possible to remove the phase shifter card and replace it with a new card that has updated/different phase shifter integrated circuits. That is, the phase shifter card is replaceable without affecting the components of the antenna card and the chip carrier card. The ability to replace card 226 that contains new phase shifters enables the modularity of the entire scanning array communications system. In some embodiments, the antenna card 220 and the phase shifter card 228 are each attached to the cooling block 222 using mechanical fasteners 232 (for example, screws, clips, or any other known mechanical fastener), which are not shown here.

Phase shifter circuits 230 (for example, integrated circuits) are assembled on the phase shifter card 228. The ability to separate the chip carrier card 226, phase shifter card 228, cooling block 222, and antenna card 220 from each other permit the modularity of the system.

Figures 3A, 3B:
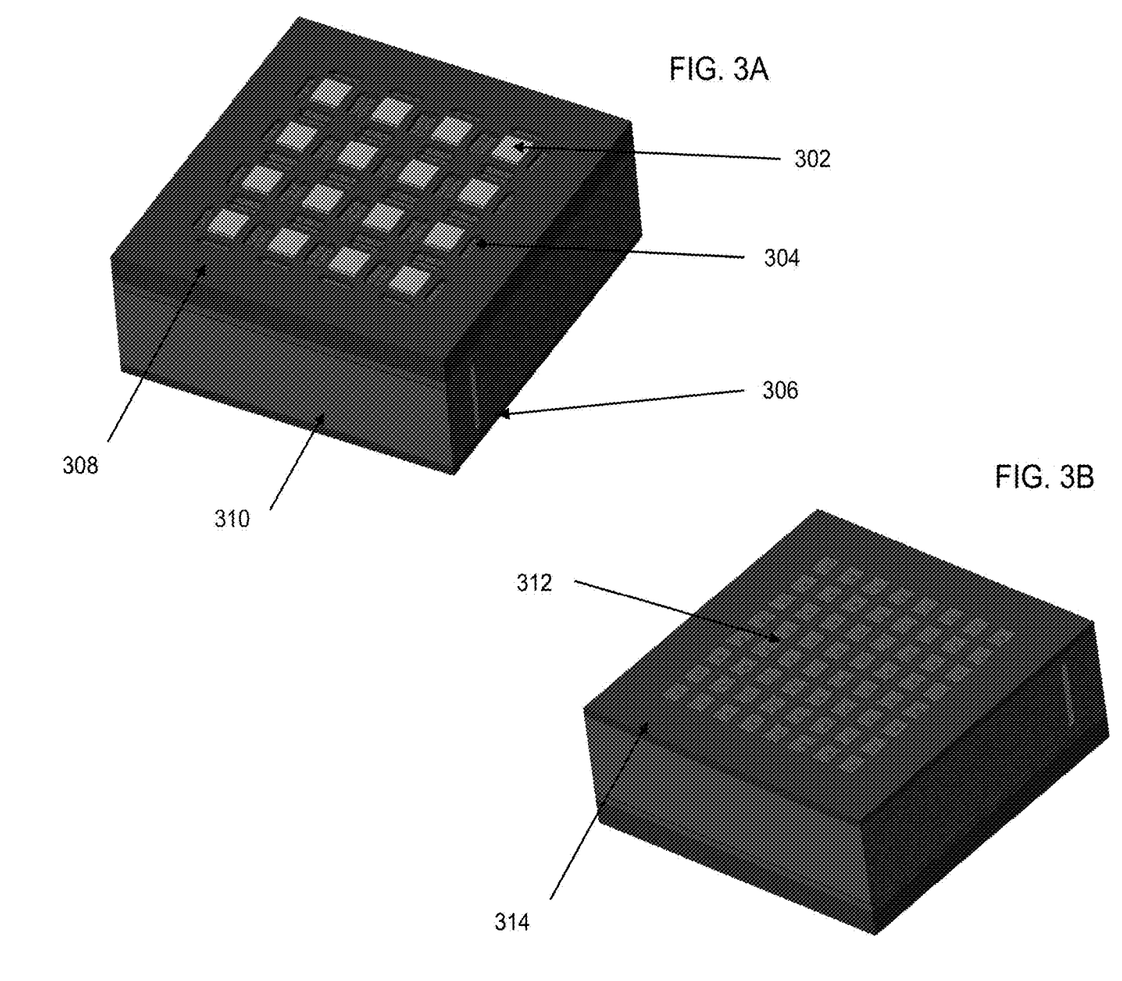
FIG. 3A is an exemplary simplified rear view of an assembled communication system, according to some embodiments of the disclosed invention.
FIG. 3B is an exemplary simplified front view of an assembled modular communication system, according to some embodiments of the disclosed invention.

FIG. 3A is an exemplary simplified rear view and FIG. 3B is an exemplary simplified front view of an assembled modular communication system, according to some embodiments of the disclosed invention. As shown, phase shifter circuits 302, MMICs 304 mounted on posts (the posts are obscured by the phase shifter card in this view, see 604 in FIG. 6A for a clearer view of the MMIC mounted on the posts), phase shifter card 306, cooling block 308, chip carrier layer 310, antenna card 312, and a single patch antenna 314 are visible, which are described above with respect to FIGS. 2A and 2B.

In some embodiments, the modular communication system is assembled in the following modular way. The MMIC chip carrier (e.g., 226 in FIG. 2C and 310. In FIG. 3) is attached to the cooling block 308 (e.g., a water block) using a thermally conductive epoxy, for example, a thermal interface compound 224. The chip carrier includes posts (see for example, FIG. 6A) that allow MMICs to be placed close to the top of the phase shifter card 308 for routing and wire bonding purposes. The Phase shifter card 306 is placed on top of the chip carrier (i.e., the layer that contains the MMICs) with a plurality of MMIC chip carrier posts positioned in the cavities in the phase shifter card.

In some embodiments, the cavities in the phase shifter card 306 may be formed by a subtractive process (such as milling) or could be defined by a buildup printed circuit board manufacturing technique. The cross-sectional area of these cavities is slightly larger than the posts (allowing the posts to slide into the cavities) and have internal conductive pads near the edges allowing the wire bonds to connect the MMICs 304 to the phase shifter card 306. These cavities are located near the phase shifter circuits 302 at a regular pattern to ensure the design and associated RF routing pattern can be scaled in the X-Y plane. In some embodiments, the close proximity and periodic spacing of the MMICs 304 to the phase shifting integrated circuits 302 provide a phase matched network for the scanning array communications system. The MMICs 304 are wire bonded to the phase shifter card and coaxial cables (or a similar RF routing) to feed signals from the phase shifter card 306 to the antenna card 312.

Figures 4A, 4B:
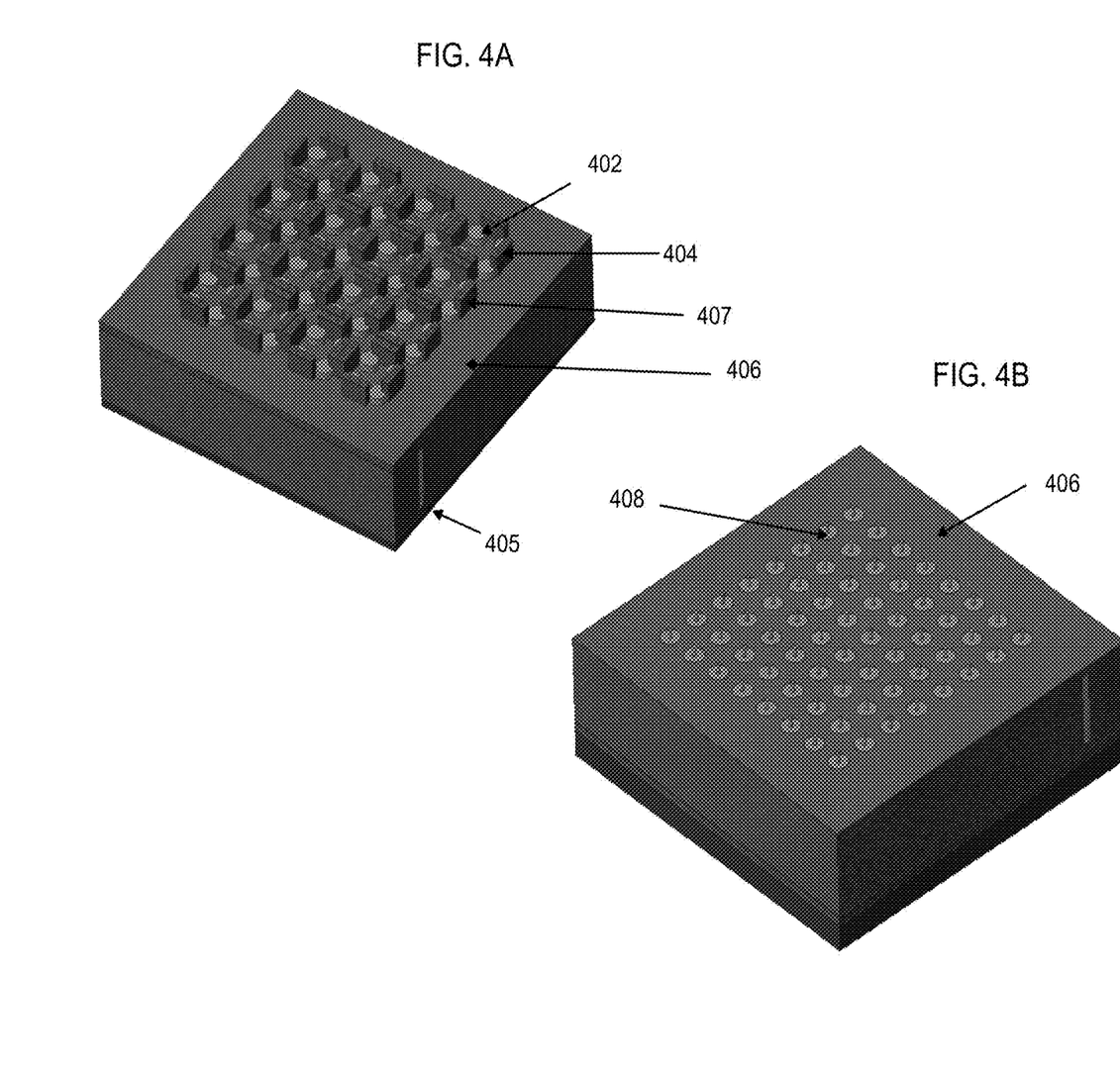
FIG. 4A is an exemplary simplified diagram of a modular communication system with the phase shifter card removed, according to some embodiments of the disclosed invention.
FIG. 4B is an exemplary simplified diagram of a modular communication system with the antenna card removed, according to some embodiments of the disclosed invention.

FIG. 4A is an exemplary simplified diagram of a modular communication system with the phase shifter card removed, according to some embodiments of the disclosed invention. As shown, a coax cable routing interface 402 (the interface of the cable that would attach to the phase shifter card) mates to the phase shifter card. The coax cables connect the phase shifter card to the antenna card providing a means of routing the signals from the phase shifting and amplifier electronics to the patch antenna array through the cooling block. Although, a specific coax cable routing is shown herein for illustration purposes, in practice, a variety of different RF routing techniques may be employed to route the RF signal from the phase shifter card to the antenna card through the cooling block 405. MMICs 404 on top of thermally conductive posts 407 are attached to the chip carrier 406. The chip carrier 406 itself is attached to the cooling block 405, using thermal interface compound material, as described with respect to FIG. 2C. The coax cables 402 route RF signals, amplified by the MMICs 404, from the phase shifter card (not shown) to the antenna card (not shown) through the cooling block 405. In some embodiments, there is no routing that occurs on the chip carrier, which is a metal block that the MMICs are attached to. The MMICs are placed on thermally conductive posts 407 (e.g., copper posts) so that they are mounted flush to the phase shifter card to assist with the wire bonding process.

The copper chip carrier acts as a surface to permit the bonding of the copper posts and functions as a heat spreader to improve thermal performance. In addition to this, the chip carrier provides a surface to permit easier assembly of the MMICs onto the copper posts as the entire chip carrier (once posts and MMICs are attached) can be bonded onto the cooling block with thermal epoxy. Note that the copper posts don't necessarily need to be bonded to the chip carrier. Alternatively, the chip carrier (starting with thick block of copper) can be machined away leaving a set of exposed posts that the MMICs can be attached to.

FIG. 4B is an exemplary simplified diagram of a modular communication system with the antenna card removed, according to some embodiments of the disclosed invention. In this view, the coax cable terminations 408 on the opposite sides of the modular communication system are visible. Note that the coax cables shown in 408 route through the cooling block 405. In some embodiments, the coax cable connections (with terminations 408) are arranged in a periodic arrangement in the cooling block 405 that closely corresponds to the periodicity of the patch antenna array.

Figure 5A:
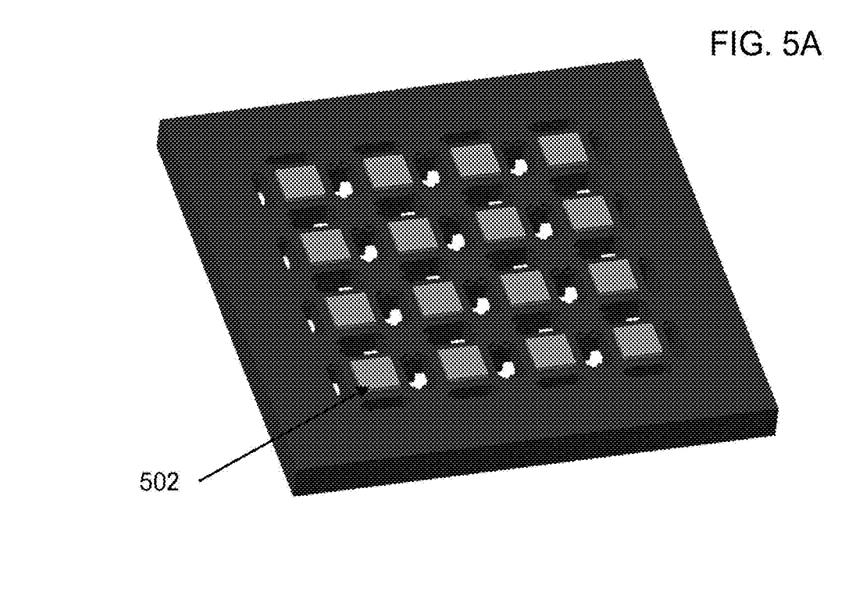
FIG. 5A is an exemplary simplified prospective view and FIG. 5B is an exemplary simplified top view of a phase shifter card, according to some embodiments of the disclosed invention.
Figure 5B:
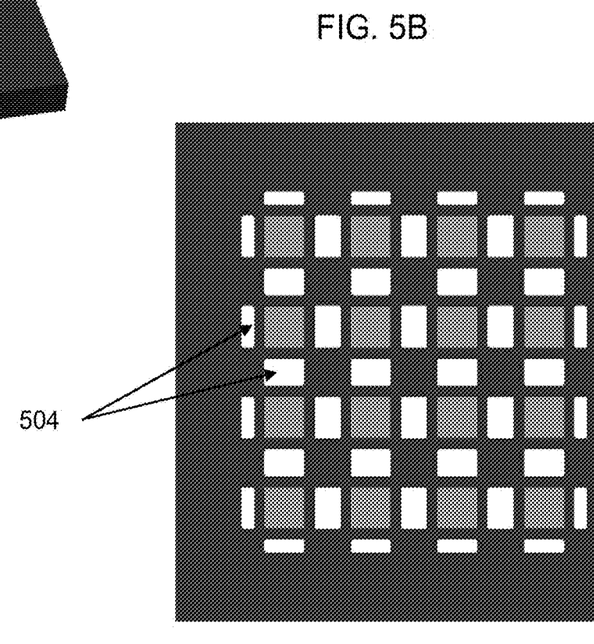

FIG. 5A is an exemplary simplified prospective view and FIG. 5B is an exemplary simplified top view of a phase shifter card, according to some embodiments of the disclosed invention. As shown, the phase shifter card includes the phase shifter circuits 502 and cavities 504 cut into the card (e.g., a PCB) permitting the MMICs resting on copper posts (not shown here) to be located nearly flush with the phase shifter card. In some embodiments, the cavities can be formed using a subtractive process (milling the PCB) or defined as cavities from the outset if a built up process is utilized. This permits the MMICs (not shown) to be wire bonded to the phase shifter card ensuring RF signals can route between the card and the MMICs (see, e.g., item 810 in FIG. 8 for the wire bond locations).

Figures 6A, 6B:
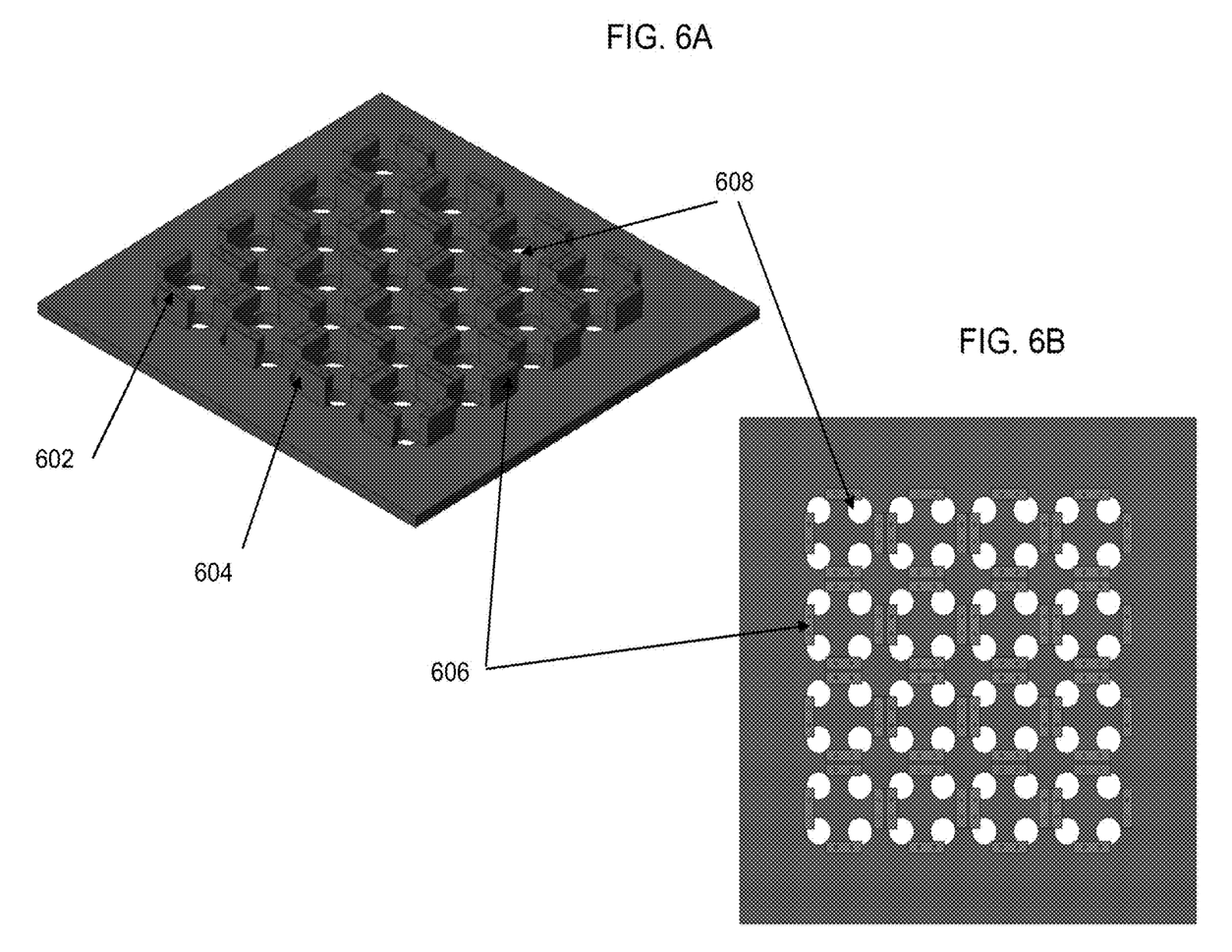
FIG. 6A is an exemplary simplified prospective view and FIG. 6B is an exemplary simplified top view of a chip carrier card with MMICs, according to some embodiments of the disclosed invention.

FIG. 6A is an exemplary simplified prospective view and FIG. 6B is an exemplary simplified top view of a chip carrier card with MMICs, according to some embodiments of the disclosed invention. A shown, the chip carrier card include MMICs 602 mounted on posts 604 (e.g., copper posts). Also, openings 606 are drilled into the chip carrier card to allow the coax cables to route the RF signal from the phase shifter card (not shown) to the antenna card through the cooling block. There are several ways the conductive posts can be attached to the chip carrier. For example, conductive posts can be defined via a subtractive process, where a single thick block of conductive material for example, copper, is milled down using a computer controlled milling machine. With this process, the conductive posts are defined as the regions not removed during the milling process and the chip carrier and posts are single monolithic piece of copper.

Another approach is that the conductive posts may be placed on the copper (or other conductive material) chip carrier with a brazing compound put between the post and the chip carrier. The copper posts, braze compound, and chip carrier are then heated in a braze oven joining the copper posts 604 to the chip carrier. Thereafter, the chip carrier and copper posts 604 are fabricated by any technique, a thermal interface compound is spread on the top of each copper pillar 604. A pick and place tool attaches the MMIC 602 to the top of the copper pillar. Subsequently, the entire assembly shown in FIGS. 6A and 6B is mounted on top of the cooling block, but under the phase shifter card. See, for example, FIG. 2C). The chip carrier provides a mounting surface for the MMICs 602 and a thermally conductive substrate (as the chip carrier attaches to the cooling block (see, for example, FIG. 2C and FIG. 3A) ensuring that the MMICs do not overheat during operation. The posts 604, on which the MMICs rest, are positioned in the phase shifter cavities to permit wire bonding from the MMICs to the phase shifter card. Openings 606 in the chip carrier card permit RF routing from the phase shifter card to the antenna card, on each side of the chip carrier card, via coax cables (e.g., 402, in FIGS. 4A and 4B).

Figures 7, 8:
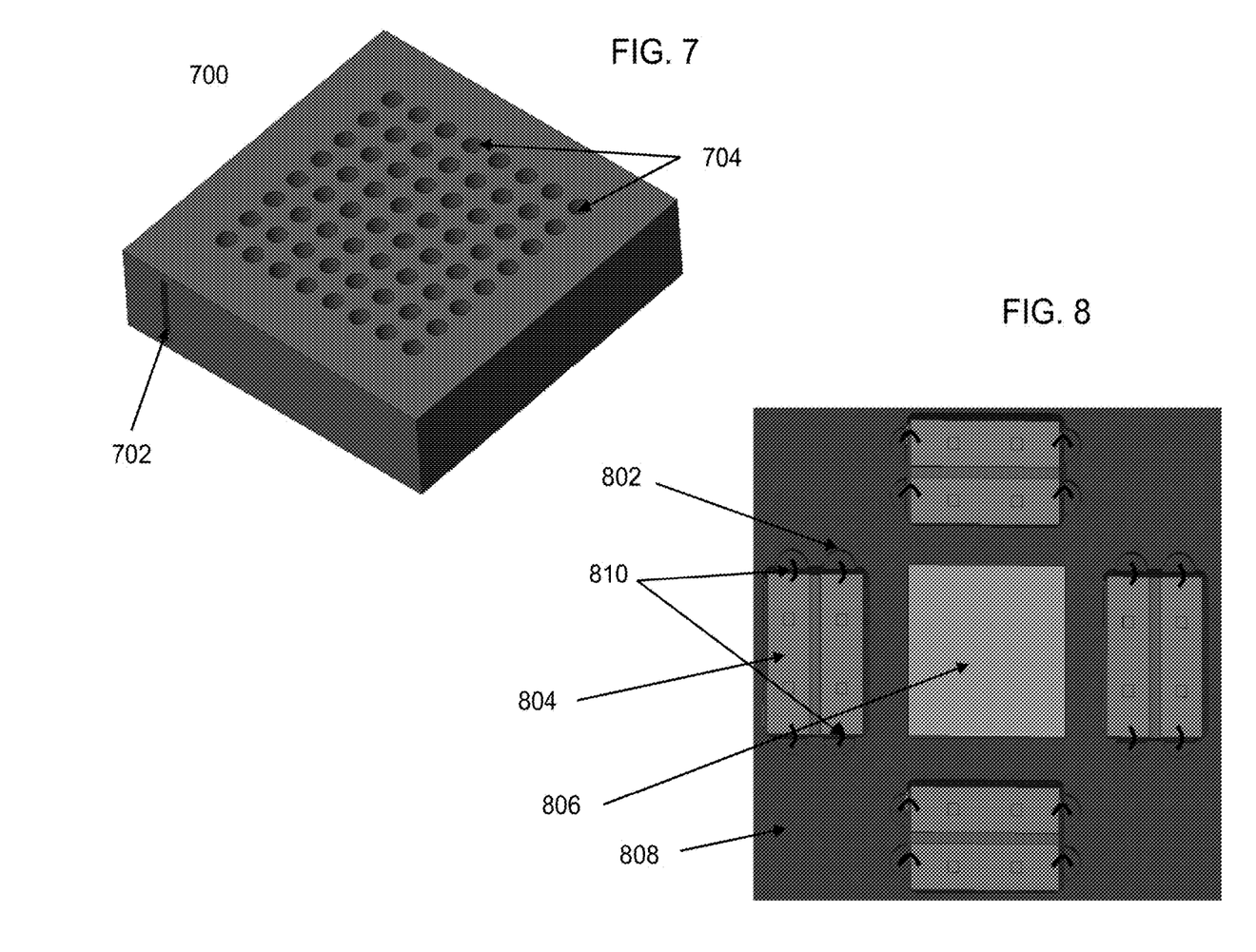
FIG. 7 is an exemplary simplified view of a cooling block, according to some embodiments of the disclosed invention.
FIG. 8 is an exemplary simplified view of a magnified view of a single phase shifter IC and the associated MMICs, according to some embodiments of the disclosed invention.

FIG. 7 is an exemplary simplified view of a cooling block 700, according to some embodiments of the disclosed invention. The cooling block 700 provides cooling for the MMICs as well as the phase shifter circuits, where both the phase shifter and antenna card rest thereon. Coolant (e.g., water or other coolants) enters the side of the block via an opening 702 and flows in a serpentine path (not shown) and exits the opposite side, via another opening. Openings 704 permit RF routing from the phase shifter card to the antenna card (shown in FIGS. 2A, 2B and 2C).

FIG. 8 is an exemplary simplified view of a magnified view of a single phase shifter circuit 806 and the associated MMICs 804, according to some embodiments of the disclosed invention. The wire bonding cavities 802 allow the wire bonds 810 to connect various components together, as described above. MMIC 804 and phase shifter circuit 806 are placed on the surface 808 of the phase shifter card.

In some embodiments, a combination of two or more of cavities in the phase shifter card, posts on the MMIC chip carrier for wire bonding, holes in the cooling block for coax cable (or other RF) routing, and the separate PCB for the antenna card that mates to a coax cable output provide for a modular electronically scanned array communication system. This way, the phase shifting, power amplifier, cooling, and antenna cards are can easily be separated, which enhances obsolescence management and the ability to improve design as new components become available.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope of the invention as defined by the appended drawings and claims.

The invention claimed is:

1. A modular communications array comprising:
   an antenna card including a patch antenna array for communicating RF signals;
   a chip carrier card including a plurality of monolithic microwave integrated circuits (MMICs), each with a power amplifier (PA) and positioned on a respective metal post of a plurality of metal posts, wherein;
   a phase shifter card including a plurality of phase shifter circuits for beam steering and gain control and a plurality of cavities, wherein each of the cavities corresponds to a location for the respective metal post on the chip carrier card; and
   a cooling block coupled to the chip carrier card by a thermally conductive epoxy for cooling, wherein the phase shifter card is replaceable without affecting the components of the antenna card and the chip carrier card.

2. The modular communications array of claim 1, wherein each respective metal post on the chip carrier card is configured as a thermal conduction pathway to the cooling block.

3. The modular communications array of claim 1, wherein the plurality of metal posts are made of copper.

4. The modular communications array of claim 1, wherein a cross-sectional area of the cavities is larger than a size of the top view footprint of the posts to allow the posts to slide into the cavities.

5. The modular communications array of claim 1, further comprising coaxial cable routing for routing the RFs signal from the phase shifter card to the antenna card through the cooling block.

6. The modular communications array of claim 1, wherein the metal posts are attached to the chip carrier card by a subtractive process or by a brazing compound.

7. The modular communications array of claim 1, wherein each of the cavities includes conductive pads for wire bonds to connect the MMICs to the phase shifter card.

8. The modular communications array of claim 1, wherein the cavities are located close to the phase shifter circuits at a regular pattern to enable RF routing to be scaled in a plane.

9. The modular communications array of claim 1, wherein the MMICs further include a switch and a low power amplifier.

* * * * *